United States Patent
Islam et al.

(10) Patent No.: US 6,282,671 B1
(45) Date of Patent: Aug. 28, 2001

(54) METHOD AND SYSTEM FOR IMPROVED EFFICIENCY OF PARITY CALCULATION IN RAID SYSTEM

(75) Inventors: Shah Mohammad Rezaul Islam, Cary; Linda Ann Riedle, Apex, both of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/189,689

(22) Filed: Nov. 10, 1998

(51) Int. Cl.[7] .......................... G06F 11/10; H03M 13/00
(52) U.S. Cl. ................................. 714/6; 711/114
(58) Field of Search ................. 714/6, 801, 766; 711/143, 113, 114, 155

(56) References Cited

U.S. PATENT DOCUMENTS

| | | | |
|---|---|---|---|
| 3,905,023 | * | 9/1975 | Perpiglia . |
| 5,315,602 | * | 5/1994 | Noya et al. . |
| 5,572,660 | * | 11/1996 | Jones . |
| 5,594,862 | * | 1/1997 | Winkler et al. . |
| 5,794,069 | | 8/1998 | Chisholm et al. ................... 395/822 |

\* cited by examiner

*Primary Examiner*—Gopal C. Ray
(74) *Attorney, Agent, or Firm*—Bracewell & Patterson, LLP

(57) ABSTRACT

The method and system for improved efficiency and parity calculation in RAID data storage system. RAID data storage systems permit recovery of data in the event of a drive failure by storing a parity value for each stripe of data on a separate drive. Each time data is written to a RAID data storage the parity value for the associated data stripe must be updated. Parity may be calculated utilizing two different algorithms. New parity may be calculated utilizing the old data value, the new data value and the old parity value, or calculated utilizing the new data value and all remaining old data within the associated data stripe. The number of input/output operations required to calculate parity utilizing each algorithm is predetermined and the method requiring the least number of input/output operations is selected, unless data sequentiality is detected. If sequential data is present the parity value is calculated utilizing the new data and all old data in the associated data stripe, even if a greater number of input/output operations are initially required, as further sequential input/output operations will be more efficient.

12 Claims, 2 Drawing Sheets

METHOD AND SYSTEM FOR IMPROVED EFFICIENCY OF PARITY CALCULATION IN RAID SYSTEM

BACKGROUND OF THE INVENTION

1. Technical Field

The present invention relates in general to an improved data storage system and in particular to an improved RAID data storage system. Still more particularly, the present invention relates to a method and system for improved efficiency of parity calculated in a RAID data storage system.

2. Description of the Related Art

As the performance of microprocessor and semiconductor memory technology increases, there is a need for an improved magnetic disk storage technology with comparable performance enhancements. Unfortunately, the performance of newer processor and semiconductor memory technologies have outpaced that of magnetic disk storage technology. In 1988 however, a paper was published by Patterson, Gibson, Katz, *A Case for Redundant Arrays of Inexpensive Disks (RAID)*, International Conference on Management of Data, pgs. 109–116, June 1988. This paper laid the foundation for the use of redundant arrays of inexpensive disks that would not only significantly improve the data transfer rate and data I/O rate over a comparable single disk access, but would also provide error correction redundancy and lower cost. In the paper noted above, the authors describe "levels" of RAID systems, which are described below, (RAID-1 through RAID-5). Since that time other RAID levels have also been described, two of which are also briefly noted below (RAID-0 and RAID-6).

Most RAID systems incorporate redundancy in some form of data interleaving, which distributes the data over all of the data disks in the array. Redundancy usually in the form of an error correcting code, with simple parity schemes predominating. However, RAID-1 uses a "mirroring" redundancy scheme in which duplicate copies of the same data are stored on two separate disks in the array. Parity and other error correcting codes are either stored on one or more disks dedicated for that purpose only, or distributed over all of the disks within an array. Data interleaving is usually in the form of data "striping" in which the data to be stored is broken down into blocks called "stripe units" which are then distributed across the data disk. A typically size of a stripe unit is 8K through 64K bytes. A "stripe" is a group of corresponding stripe units, one stripe unit from each disk in the array. Thus, the "stripe size" is equal to the size of a stripe unit times the number of data disks in the array. Data interleaving may also be accomplished on a bit-by-bit basis, such as is described in more detail below with regard to RAID-3. Six levels of RAID will now be described.

RAID-0 utilizes data striping, but does not use redundancy. RAID-0 has a lower cost than any other RAID level, and its write performance is the best because there is no writing of redundant information. The primary disadvantage of RAID-0 is its lack of redundancy. Consequently, any single disk failure in the array results in lost data.

RAID-1 uses mirroring in which identical data is stored on two disks. An advantage of RAID-1 is that it is simple to implement in software. RAID-1 is also error correcting because complete recovery is possible from the failure of any one disk drive by simply switching to the drive that contains the duplicate copy of the data. After replacing the defective drive, the data on the duplicate drive can be recopied to the replacement drive. When servicing two or more requests to read data that is stored on the same disk, RAID-1 has a faster read rate than RAID-0 because one request can be serviced from the first disk, and the second request can be simultaneously serviced by the duplicate disk. A disadvantage of RAID-1 is that it is expensive because it requires two times the number of drives necessary to store the same data. Thus, its efficiency is always ½. The necessity of making duplicate copies of all data also makes this RAID level somewhat slow to write data.

RAID-2 uses error correcting codes such as those found in error correcting semiconductor memory systems.

RAID-3 uses a separate parity disk to store error correcting parity information and a plurality of data disks that contain bit interleaved data information. Unlike semiconductor memories, a faulty disk drive is usually easily identified because disk drives and their associated controllers typically contain sophisticated error detecting mechanisms that can quickly identify a failed drive. Consequently, if a single data drive has failed, the contents of the failed drive can be easily reconstructed using the information from the "good" data drives plus the parity drive. Conceptually, the reconstruction of a specific bit of a failed drive could be accomplished by calculating the parity of the corresponding bit of each of the "good" drives and then comparing it to the corresponding bit of the parity drive. For example, if the parity of the first bit of each of the "good" drives is a logical 0, and the first bit of the parity drive is a logical 1, then the first bit of the failed drive must have been a logical 1 (because the parity of the first bit of all the data drives must equal logical 1, in this example). Mathematically speaking, the data on the failed disk can be calculated by starting with the parity information from the parity drive and subtracting, modulo two, the corresponding information on the "good" data drives. If, on the other hand, the parity drives fails, parity is easily reconstructed from all the data drives.

For this RAID level, data is bit interleaved on the data disks. For example, a basic RAID-3 system in which data is organized in 8 bit bytes and having 8 data disks and one parity disk would store the first bit of every byte on the first disk, the second bit of every byte on the second disk, and so on. Thus, a write request simultaneously accesses all 8 data disks plus the parity disk, while a read request accesses all 8 data disks. Consequently, the data rate, which is the rate at which data can be written to or read from sequential locations on the disk without head repositioning, is very high for RAID-3. A primary disadvantage of this RAID level is that it only permits one request to be serviced at any one time. RAID-3 systems also have relatively low I/O rates, which is the rate at which data can be written to random locations on the disk, thereby requiring frequent head repositioning.

RAID-4 also uses a separate parity disk to store error correcting parity information and a plurality of data disks that contain interleaved data information. Unlike RAID-3, in which data is bit interleaved across the data disks, RAID-4 uses block interleaving or data spring, which is described in more detail above.

The performance of RAID-4 is particularly dependent on the type of access requested, read or write, and the size of the requested access relative to the size of the stripe unit and the size of the stripe. A request to read a block of data that is contained entirely within one stripe unit can be quickly serviced as soon as the disk drive containing the requested data becomes available. Consequently, multiple requests to read various blocks of data, each of which is entirely contained within one stripe unit on a different data drive, can be serviced simultaneously. In contrast, a RAID-3 system must service multiple requests serially, and if head repositioning is required between the servicing of each request, the performance of a RAID-3 system will be dramatically slower than a RAID-4 system for this type of access. A read operation of stripe size data blocks can also be very fast in RAID-4, particularly if scheduling permits all data disks to be accessed at one time.

A request to write data to a single stripe unit can be a relatively slow process, because it requires four disk accesses. Specifically, a data write to a single stripe unit requires that the old data and corresponding parity information be read from the appropriate data disk and the parity disk. Next, new parity information is computed using the old data, the new data and the old parity. Finally, the new data and the new parity are written to the data and parity disks, respectively. Requests for multiple writes to various stripe units located on different drives and in different stripes is even more problematic, because each write requires a read and write operation to the parity disk and, since there is only one parity disk, it can become "bottle necked." Writing an entire stripe of data is much easier because no read operations are required and the parity for the new stripe of data is easily computed.

RAID-5 is similar to RAID-4 in that it interleaves data by stripe units across the various disk drives, and also stores error correcting parity information. In RAID-5, however, there is no dedicated parity disk as there is in RAID-3 and RAID-4. Instead, RAID-5 distributes parity across all the disk drives, thereby eliminating the parity disk bottleneck problem described above with regards to certain write operations of RAID-4 systems. Furthermore, because RAID-5 distributes data over all the disks, and RAID-4 only distributes data over the data disks (which is equal to the total number of disks minus the total number of parity disks), RAID-5 has a slight performance advantage over RAID-4. With these performance enhancements, RAID-5 is usually preferred over RAID-4 and, consequently, most RAID-4 systems have disappeared from the market to be replaced by RAID-5 systems.

RAID-6 is similar to RAID-5 in that it interleaves data in stripe units and distributes parity information across all the disk drives. A disadvantage of RAID-5, as well as RAID-3 and RAID-4, is its inability to correct a failure in more than one single disk. As the size of disk arrays increases, however, the probability of a failure is more than one drive also increases which, in turn, increases the chance of an unrecoverable failure. To overcome the problem of a two disk failure, RAID-6 uses Reed-Solomon codes in a P+Q redundancy scheme that can recover from a failure of any two disks. One disadvantage of RAID-6 over RAID-5, however, is in the write performance of small amounts of data are slow in RAID-5 because of four data accesses are required. For such small write operations, RAID-6 is even more inefficient because it requires a total of six access to update both the "P" and "Q" information.

From a review of the above it may be seen that in larger arrays of disk the calculation of parity for a data stripe which is necessary upon the updating of data within that stripe can be substantially time consuming. It would thus be desirable to provide a method and system for improved efficiency of parity calculation in a RAID data storage system.

SUMMARY OF THE INVENTION

It is therefore one object of the present invention to provide an improved data storage system.

It is another object of the present invention to provide an improved RAID data storage system.

It is yet another object of the present invention to provide an improved method and system for enhancing the efficiency of parity calculation in a RAID data storage system.

The foregoing objects are achieved as is now described. RAID data storage systems permit recovery of data in the event of a drive failure by storing a parity value for each stripe of data on a separate drive. Each time data is written to a RAID data storage system the parity value for the associated data stripe must be updated. Parity may be calculated utilizing two different algorithms. New parity may be calculated utilizing the old data value, the new data value and the old parity value, or calculated utilizing the new data value and all other old data within the associated data stripe. The number of input/output operations required to calculate parity utilizing each algorithm is predetermined and the method requiring the least number of input/output operations is selected, unless data sequentiality is detected. If sequential data is present the parity value is calculated utilizing the new data and all remaining old data in the associated data stripe, even if a greater number of input/output operations are initially required, as further sequential input/output operations will be more efficient.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
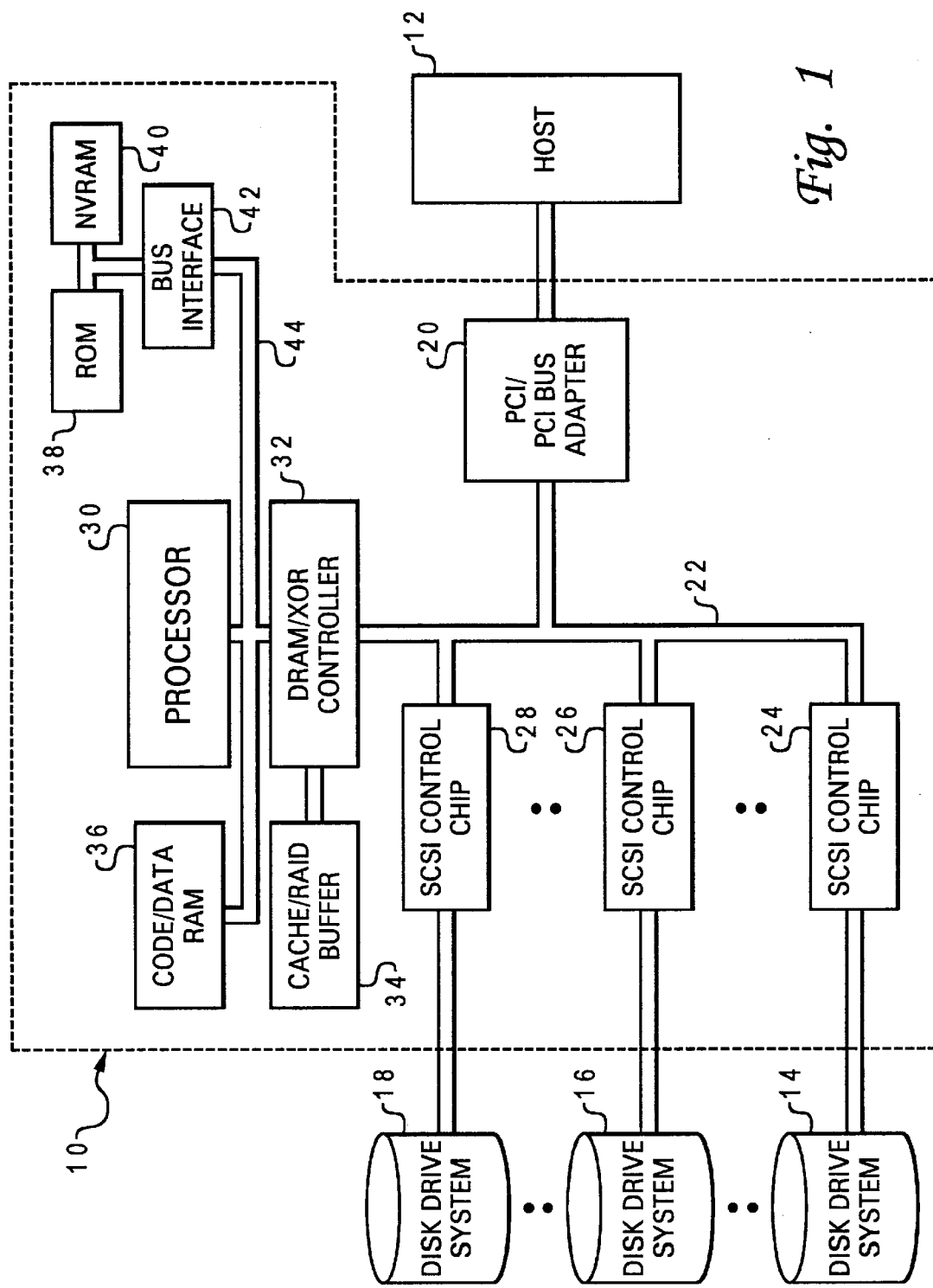
FIG. 1 is high level block diagram of a RAID data storage system which utilizes the method and system of the present invention.

With reference now to the figures and in particular with reference to FIG. 1, there is depicted a block diagram of a RAID data storage system which may be utilized to implement the present invention. As depicted, RAID data storage system 10 is coupled to host processor 12 via PCI/PCI bus adapter 20.

As illustrated, processor 30 is utilized to control RAID data storage system 10. Processor 30 is preferably an advanced microprocessor such as the 403GCX Power PC™ Processor manufactured by International Business Machines Corporation of Armonk, N.Y. Processor 30 is coupled to processor bus 44. As depicted, also coupled to processor bus 44 is code/data RAM 36 which is utilized to temporarily store code and data utilized by processor 30. ROM 38 and non-volatile random access memory (NVRAM) 40 are also coupled to processor bus 44 via bus interface 42. Those skilled in the art will appreciate that ROM 38 and NVRAM 40 are typically accessed utilizing a 8 bit bus and thus bus interface 42 is utilized to interface those devices to a processor bus 44, a 32 bit bus.

Operational code is typically stored within ROM 38 which, as those skilled in the art will appreciate, is generally provided utilizing so-called "flash" ROM. Operational code is thereafter fetched from ROM 38 by processor 30 upon initiation of operation. NVRAM 40 is typically a low power CMOS memory which is powered for "back-up" by a battery such that the information stored in NVRAM will not be lost when main power is terminated. Thus, NVRAM 40 may be utilized to store configuration data or operational code in a manner similar to that stored within ROM 38. ROM 38 is generally updated at initial power application and any changes to system configuration during operation are stored within NVRAM 40 and then entered into a "device change list" which is also stored within NVRAM 40 and on each disk drive within the system.

A cache/RAID buffer 34 is also provided and is coupled to DRAM/XOR controller 32. DRAM/XOR controller 32 is utilized to control access to random access memory and also provides a hardware implemented exclusive or (XOR) circuit which may be utilized to rapidly and efficiently calculate parity for changes in updated data in a manner which will be explained in greater detail herein.

DRAM/XOR controller 32 is coupled to local bus 22. Also coupled to local bus 22 are multiple small computer system interface (SCSI) control chips 24, 26 and 28. Those having ordinary skill in this art will appreciate that alternative bus architectures may be utilized; however, the depicted embodiment of the present invention utilizes multiple disk drive systems 14, 16 and 18 which are configured in the SCSI bus architecture.

As described above, each time data is written which does not span an entire data stripe within RAID data storage system 10 a new parity value must be calculated in order to permit data to be recovered in an event of a disk failure. There are two algorithms which are utilized to calculate parity. The first parity calculation, refer to herein as a "Read Modify Write" parity or "RMW" parity is calculated by combining the old parity value in an exclusive or operation with the old data which has been combined in an exclusive or operation with the new data in order to arrive at a new parity. The second algorithm for parity calculation is known as a full exclusive or "full XOR" calculation. In this algorithm a new parity is calculated by combining, utilizing an exclusive or (XOR) operation, the new data and all remaining old data within a particular data stripe to arrive at a new parity value. The exclusive (XOR) operations are preferably accomplished utilizing DRAM/XOR controller 32.

Upon reference to this description those skilled in the art will acknowledge that the RMW algorithm may require three or four input/output operations per "chunk" of data, where a chunk is a group of valid continuous sectors, depending whether or not the old parity value is present within cache buffer 34 (see FIG. 1). The full XOR algorithm is variable and depends upon the amount of data being written, the size of the stripe, and the residency of any old data pages within cache buffer 34. For example, a ten drive RAID-5 array, with a write of 8 full data pages would require a minimum of 24 input/output operations utilizing the RMW parity calculation algorithm and a maximum of 10 input/output operations to calculate new parity utilizing the full XOR parity calculation. Thus, those skilled in the art appreciate that selection of the appropriate algorithm for parity calculation can be very important.

Figure 2:
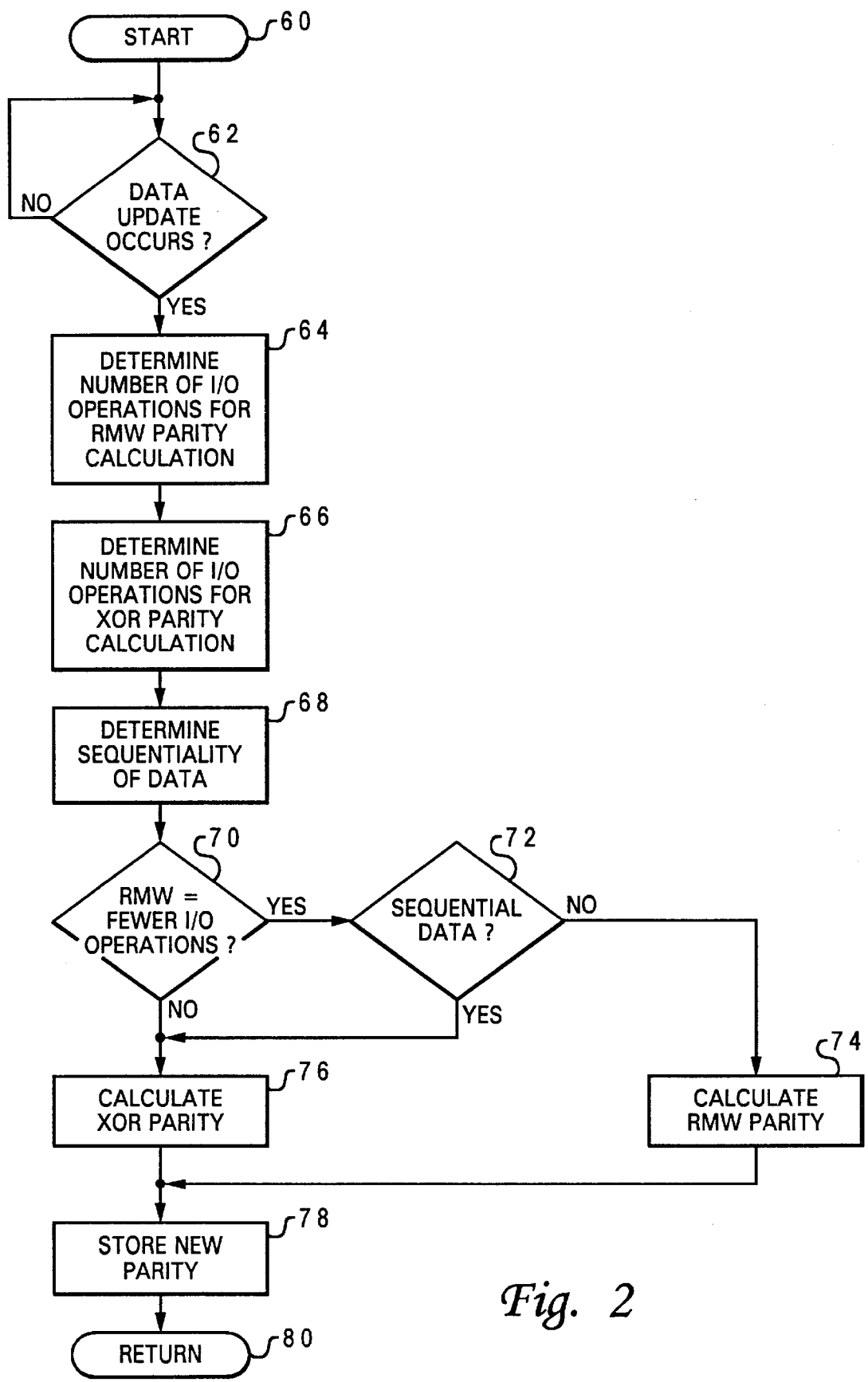
FIG. 2 is a high level flowchart of the method of the present invention.

Referring now to FIG. 2 there is depicted a high level block diagram which illustrates the method of the present invention. It should be appreciated by those skilled in the art that FIG. 2 represents a self-consistent sequence of steps leading to a desired result. The steps are those requiring physical manipulation of physical quantities. Usually, although not necessarily, these quantities take the form of electrical or magnetic signals capable of being stored, transferred, combined, compared and otherwise manipulated. It has proven convenient at times by those skilled in the art to refer to these signals as bits, values, elements, symbols, characters, terms, numbers or the like. It should be born in mind, however, that all of these and similar terms are to be associated with the appropriate physical quantities and are merely convenient labels applied to those quantities.

Further, the manipulations performed are often referred to terms, such as adding or comparing, which are commonly associated with mental operations performed by human operator. No such capability of a human operator is necessary or desirable in most cases in any of the operations described herein which form part of the present invention; the operations are machine operations. Useful machines for performing operations of a preferred embodiment of the present invention include data processing systems such as general purpose digital computers or other similar devices. In all cases the distinction between the method operations and operating a computer and the method of computation itself should be born in mind. The present invention relates to method steps for operating a processor, such as processor 30 of FIG. 1, in processing electrical or other physical signals to generate desired physical signals. As illustrated, the process described in FIG. 2 begins at block 60 and thereafter passes to block 62. Block 62 depicts a determination of whether or not a data update to a partial data stripe has occurred. If not, the process merely iterates until such time as a data update occurs.

Still referring to block 62, in the event a data update occurs to a partial data stripe within RAID data storage system 10 the process passes to block 64. Block 64 illustrates a determination of the number of input/output operations which would be necessary for RMW parity calculation. The presence or absence of data or parity required for such calculation within cache buffer 34 is preferably taken into account in this determination.

Next, the process passes to block 66. Block 66 illustrates a determination of the number of input/output operations necessary for full XOR parity calculation. Once again, the presence or absence of data or parity within cache buffer 34 is taken into account in this determination.

Thereafter the process passes to block 68. Block 68 illustrates a determination of whether sequentiality exists within the data being updated. That is, is the previous page of data within cache buffer 34? The process then passes to block 70.

Block 70 depicts a determination of whether or not a calculation of RMW parity requires fewer input/output operations than a calculation of full XOR parity. If so, the process passes to block 72. Block 72 depicts a determination of whether or not the process step depicted in block 68 yielded an indication of sequential data. If not, the process passes to block 74. Block 74 illustrates the calculation of the RMW parity. The process then passes to block 78. Block 78 depicts the storing of the new parity value into a disk storage unit. Thereafter, the process passes to block 80 and returns.

Referring again to block 72, in the event the determination depicted within block 68 illustrates sequential data the process passes from block 72 to block 76. Block 76 illustrates the calculation of full XOR parity. In accordance with an important feature of the present invention the presence of sequential data requires the calculation of full XOR parity despite the possibility that a greater number of input/output operations may be required as further sequential input/ outputs will result in higher efficiency in subsequent operations. Thereafter, as above the process passes to block 78.

Block 78, as described above, depicts the storing of the new parity value into a disk storage unit. The process then passes to block 80 and returns.

Upon reference to the foregoing those skilled in the art will appreciate that the method and system of the present invention provides a technique whereby the updating of parity value within a RAID data storage may be enhanced in efficiency by determining first the method of calculating parity which results in the fewest number of input/output operations or, alternatively, in the event of sequentiality of data the method whereby subsequent sequential accesses of data will be greatly enhanced in efficiency, rendering the calculation of parity more efficient.

While the invention has been particularly shown and described with reference to a preferred embodiment, it will be understood by those skilled in the art that various changes in form and detail may be made therein without departing from the spirit and scope of the invention.

What is claimed is:

1. A method for improved efficiency of parity calculation in a RAID data storage system having a cache memory, said method comprising the steps of:

in response to each writing of updated data to replace old data within said RAID data storage system wherein said updated data does not span an entire data stripe:
predetermining a number of input/output operations required to calculate an RMW new parity value utilizing an old parity value; said old data; and, said updated data;
predetermining a number of input/output operations required to calculate an XOR new parity value utilizing said updated data and all remaining old data within said entire data stripe; and
determining if data sequentially preceding said updated data is present within said cache memory;
calculating an RMW new parity value only if calculation of said RMW new parity value requires fewer input/output operations and data sequentially preceding said updated data is not present within said cache memory; and
calculating an XOR new parity value if calculation of said XOR new parity value requires fewer input/output operations or said data preceding said updated data is present within said cache memory wherein RAID data storage system performance is optimized.

2. The method for improved efficiency of parity calculation in a RAID data storage system, having a cache memory according the claim 1, wherein said step of calculating an RMW new parity value only if calculation of said RMW new parity value requires fewer input/output operations comprises the step of calculating an RMW new parity value by combining said old parity value in an exclusive OR operation with said old data which had been combined in an exclusive OR operation with said update data.

3. The method for improved efficiency of parity calculation in a RAID data storage system, having a cache memory according the claim 1, wherein said step of calculating an XOR new parity value only if calculation of said XOR new parity value requires fewer input/output operations comprises the step of calculating an XOR new parity value by combining in an exclusive OR operation with said update data and all remaining old data within said entire data stripe.

4. The method for improved efficiency of parity calculation in a RAID data storage system, having a cache memory according the claim 1, further including the step of storing said RMW new parity value or said XOR new parity value within said RAID data storage system.

5. The method for improved efficiency of parity calculation in a RAID data storage system, having a cache memory according the claim 1, wherein said step of predetermining a number of input/output operations required to calculate an RMW new parity value utilizing an old parity value, said old data, and said updated data comprises the step of predetermining a number of input/output operations required to calculate an RMW new parity value utilizing an old parity value, said old data, and, said updated data, by considering whether said old parity value or said old data are present within said cache memory.

6. The method for improved efficiency of parity calculation in a RAID data storage system, having a cache memory according the claim 1, wherein said step of predetermining a number of input/output operations required to calculate an XOR new parity value utilizing said updated data and all remaining old data within said entire data strip comprises the step of:

predetermining a number of input/output operations required to calculate an XOR new parity utilizing said updated data and all remaining old data within said entire data stripe considering whether said remaining old data is present within said cache memory.

7. The system for improved efficiency of parity calculation in a RAID data storage system having a cache memory, said system comprising:

a processor for predetermining a number of input/output operations required to calculate an RMW new parity value utilizing an old parity value; said old data; and, said updated data, in response to each writing of updated data replace old data within said RAID data storage system wherein said updated data does not span an entire data stripe, and for predetermining a number of input/output operations required to calculate an XOR new parity value utilizing said updated data and all remaining old data within said entire data stripe in response to each writing of updated data replace old data within said RAID data storage system wherein said updated data does not span an entire data stripe;
a memory controller for determining if data sequentially preceding said updated data is present within said cache memory; and
an XOR calculator for calculating an RMW new parity value only if calculation of said RMW new parity value requires fewer input/output operations and data sequentially preceding said updated data is not present within said cache memory, and for calculating an XOR new parity value if calculation of said XOR new parity value requires fewer input/output operations or said data preceding said updated data is present within said cache memory wherein RAID data storage system performance is optimized.

8. The system for improved efficiency of parity calculation in a RAID data storage system, having a cache memory according the claim 7, wherein said XOR calculator for calculating an RMW new parity value only if calculation of said RMW new parity value requires fewer input/output operations comprises an XOR calculator for calculating an RMW new parity value by combining said old parity value in an exclusive OR operation with said old data which had been combined in an exclusive OR operation with said update data.

9. The system for improved efficiency of parity calculation in a RAID data storage system, having a cache memory according the claim 7, wherein said XOR calculator for calculating an XOR new parity value only if calculation of said XOR new parity value requires fewer input/output operations comprises an XOR calculator for calculating an XOR new parity value by combining in an exclusive OR operation with said update data and all remaining old data within said entire data stripe.

10. The system for improved efficiency of parity calculation in a RAID data storage system, having a cache memory according the claim 7, further including a storage controller for storing said RMW new parity value or said XOR new parity value within said RAID data storage system.

11. The system for improved efficiency of parity calculation in a RAID data storage system, having a cache memory according the claim 7, wherein said processor for predetermining a number of input/output operations required to calculate an RMW new parity value utilizing an old parity value, said old data, and said updated data comprises a processor for predetermining a number of input/output operations required to calculate an RMW new parity value utilizing an old parity value, said old data; and, said updated data, by considering whether said old parity value or said old data are present within said cache memory.

12. The system for improved efficiency of parity calculation in a RAID data storage system, having a cache memory according the claim 7, wherein said processor for predetermining a number of input/output operations required to calculate an XOR new parity value utilizing said updated data and all remaining old data within said entire data strip comprises a processor for:

predetermining a number of input/output operations required to calculate an XOR new parity utilizing said updated data and all remaining old data within said entire data stripe considering whether said remaining old data is present within said cache memory.

* * * * *